(12) United States Patent
Ban et al.

(10) Patent No.: US 7,776,747 B2
(45) Date of Patent: Aug. 17, 2010

(54) SEMICONDUCTOR DEVICE AND METHOD FOR FORMING PATTERN IN THE SAME

(75) Inventors: Keun Do Ban, Gyeonggi-do (KR); Cheol Kyu Bok, Gyeonngi-Do (KR); Jun Hyeub Sun, Dongdaemun-gu (KR)

(73) Assignee: Hynix Semiconductor Inc., Icheon-si (KR)

( * ) Notice: Subject to any disclaimer, the term of this patent is extended or adjusted under 35 U.S.C. 154(b) by 556 days.

(21) Appl. No.: 11/759,055

(22) Filed: Jun. 6, 2007

(65) Prior Publication Data

US 2008/0160763 A1   Jul. 3, 2008

(30) Foreign Application Priority Data

Dec. 28, 2006   (KR) ............... 10-2006-0137009

(51) Int. Cl.
*H01L 21/302* (2006.01)
*H01L 21/461* (2006.01)
(52) U.S. Cl. ............ 438/690; 438/706; 438/717; 438/745
(58) Field of Classification Search ............ None
See application file for complete search history.

(56) References Cited

U.S. PATENT DOCUMENTS 7,611,980 B2 * 11/2009 Wells et al. ............ 438/597

2007/0049040 A1 * 3/2007 Bai et al. ............ 438/712
2007/0215960 A1 * 9/2007 Zhu et al. ............ 257/414
2008/0054350 A1 * 3/2008 Breitwisch et al. ............ 257/330

FOREIGN PATENT DOCUMENTS

| KR | 10-1995-0013789 | 11/1995 |
| KR | 10-1997-0007173 | 5/1997 |
| KR | 10-2001-0073304 | 8/2001 |
| KR | 10-2002-0024415 | 3/2002 |
| KR | 10-2006-0113162 | 11/2006 |

\* cited by examiner

*Primary Examiner*—Duy-Vu N Deo
(74) *Attorney, Agent, or Firm*—Marshall, Gerstein & Borun LLP

(57) ABSTRACT

A method for forming a fine pattern of a semiconductor device includes forming a first hard mask layer over a semiconductor substrate, forming a second hard mask layer pattern over the first hard mask layer, forming a spacer on a sidewall of the second hard mask layer pattern, selectively etching the first hard mask layer by using the spacer and the second hard mask layer pattern as an etching mask to form a first hard mask layer pattern, forming a first insulating film filling the second hard mask layer pattern and the first hard mask layer pattern, selectively etching the second hard mask layer pattern and the underlying first hard mask layer pattern to form a third hard mask layer pattern, removing the first insulating film and the spacer, and patterning the semiconductor substrate by using the third hard mask layer pattern as an etching mask to form a fine pattern.

17 Claims, 6 Drawing Sheets

SEMICONDUCTOR DEVICE AND METHOD FOR FORMING PATTERN IN THE SAME

CROSS-REFERENCE TO RELATED APPLICATION

The priority of Korean patent application number 10-2006-0137009, filed on Dec. 28, 2006, which is incorporated by reference in its entirety, is claimed.

BACKGROUND OF THE INVENTION

The invention relates to memory devices. More particularly, the invention relates to a method for forming a pattern in a semiconductor device by employing self aligned double exposure technology.

In general, a semiconductor device such as dynamic random access memory ("DRAM") includes numerous fine patterns. Such patterns are formed through a photolithography process. In order to form a pattern by a photolithography process, a photoresist ("PR") film is coated over a target layer to be patterned. Next, an exposure process is performed to change solubility in a given portion of the PR film. Subsequently, a developing process is performed to form a PR pattern exposing the target layer. Thus, the PR pattern is formed by removing the portion of which the solubility is changed, or by removing the portion of which the solubility is not changed. Later, the exposed target layer is etched using the PR pattern, and then the PR pattern is stripped to form a target layer pattern.

In the photolithography process, resolution and depth of focus ("DOF") are two important issues. Resolution (R) can be expressed by Equation 1 below.

$$R = k_1 \frac{\lambda}{NA}, \quad (1)$$

where k1 is a constant determined by a kind and thicknesses of PR film, $\lambda$ is a wavelength of light source, and NA stands for a "numerical aperture" of exposure equipment.

According to Equation 1, the fineness of the pattern formed over a wafer is an inverse function of the wavelength ($\lambda$) of a light source and a direct function of the NA of exposure equipment. However, the wavelength ($\lambda$) of light sources being used and the NA of exposure equipment have not kept abreast of rapid advances in integration of semiconductor devices. Therefore, resolution enhancement technology ("RET") for improving resolution and DOF has been applied by incorporating diverse methods. For example, the RET technology includes phase shift mask ("PSM"), off-axis illumination ("OAI"), optical proximity correction ("OPC"), and the like. Besides, a technology called double exposure technique ("DET") is capable of forming a fine pattern over a wafer. Critical dimension("CD") uniformity in the DET depends on overall overlay accuracy of a first exposure mask and a second exposure mask.

However, it is difficult to control the overlay of the first and second exposure masks to fall within the error range. Moreover, technical difficulties make it difficult to achieve improvement of exposure equipment.

BRIEF SUMMARY OF THE INVENTION

Embodiments of the invention are directed to an improved method for forming a pattern in a semiconductor device.

According to one embodiment of the invention, a method for forming a pattern in a semiconductor device utilizes a self aligned double exposure technology.

According to one embodiment of the invention, a method for forming a pattern in a semiconductor device includes the steps of: forming a first hard mask layer over a semiconductor substrate, forming a second hard mask layer pattern having a sidewall over the first hard mask layer, forming a spacer on a sidewall of the second hard mask layer pattern, selectively etching the first hard mask layer by using the spacer and the second hard mask layer pattern as an etching mask to form a first hard mask layer pattern underlying the second hard mask layer pattern, forming a first insulating film filling the second hard mask layer pattern and the first hard mask layer pattern., selectively etching the second hard mask layer pattern and its underlying first hard mask layer pattern to form a third hard mask layer pattern, removing the first insulating film and the spacer, and patterning the etch-target layer by using the third hard mask layer pattern as an etching mask to form a fine pattern.

According to another embodiment, a semiconductor device has fine patterns that are formed according to the method described above.

DESCRIPTION OF EMBODIMENTS

Figure 1A:
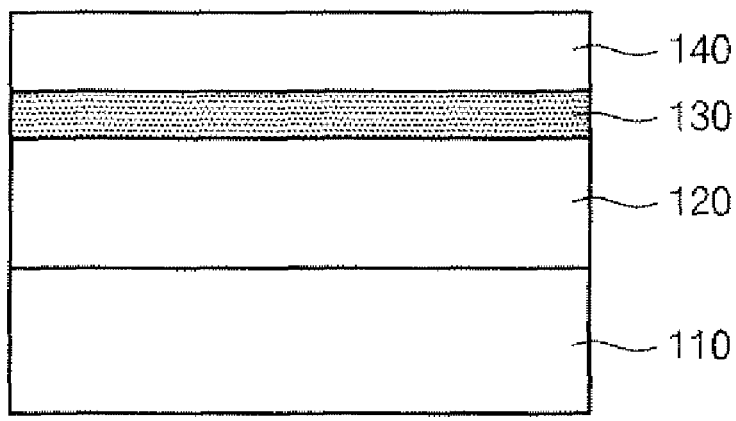
FIGS. 1a to 1k are cross-sectional views illustrating a method for forming a pattern in a semiconductor device according to an embodiment of the invention.
Figure 1B:
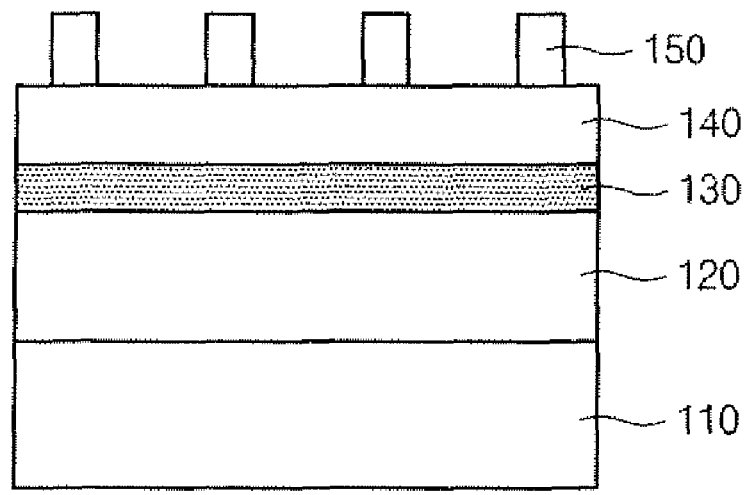
Figure 1C:
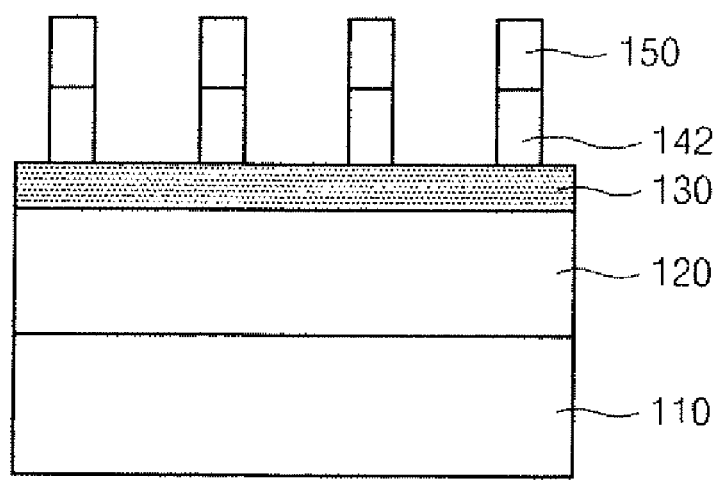

The invention relates to a semiconductor device with fine patterns that are formed on the basis of a self aligned double exposure technique. The fine patterns are realized to use the modified stacked structure of hard mask layers and sidewall spacers. Such fine patterns are uniformly formed to improve the degree of the integration and yield of semiconductor devices. According to the improved method for forming a fine pattern, the fabrication process of a semiconductor device is simplified to reduce processing costs.

FIGS. 1a to 1k are cross-sectional views illustrating a method for forming a pattern in a semiconductor device according to an embodiment of the invention. A first hard mask layer 120, a second hard mask layer 130 underlying the first hard mask layer 120, and a third hard mask layer 140 are formed over a semiconductor substrate 110 having an etch-target layer (not shown). A photoresist film (not shown) is formed over the third hard mask layer 140. The photoresist film is exposed and developed using a line/space mask (not shown) to form a photoresist pattern 150. The third hard mask layer 140 is selectively etched using the photoresist pattern 150 as an etching mask to Form a third hard mask layer pattern 142.

According to one embodiment of the invention, the first hard mask layer 120 is preferably formed of an amorphous carbon film. The second hard mask layer 130 is preferably formed of a silicon oxynitride (SiON) film. The third hard mask layer 140 is preferably formed of a polysilicon layer or a silicon oxide ($SiO_2$) film. In another embodiment, a ratio of the line width of the photoresist pattern 150 to the width of the space defined between the neighboring photoresist patterns 150 is preferably in a range of about 1.5:2.5~0.5:3.5. In addition, the ratio of the line width of the photoresist pattern 150 to the width of the space defined between the neighboring photoresist patterns 150 is preferably substantially about 1:3. In another embodiment of the invention, the selective etching process for the third hard mask layer 140 is preferably performed by an anisotropic dry etching method. In another embodiment, a ratio of the line width of the third hard mask layer pattern 142 to a width of the space defined between the neighboring third hard mask layer patterns 142 is preferably in a range of about 1.5:2.5~0.5:3.5. In addition, the ratio of the line width of the third hard mask layer pattern 142 to the width of the space defined between the neighboring third hard mask layer patterns 142 is substantially about 1:3.

Figure 1D:
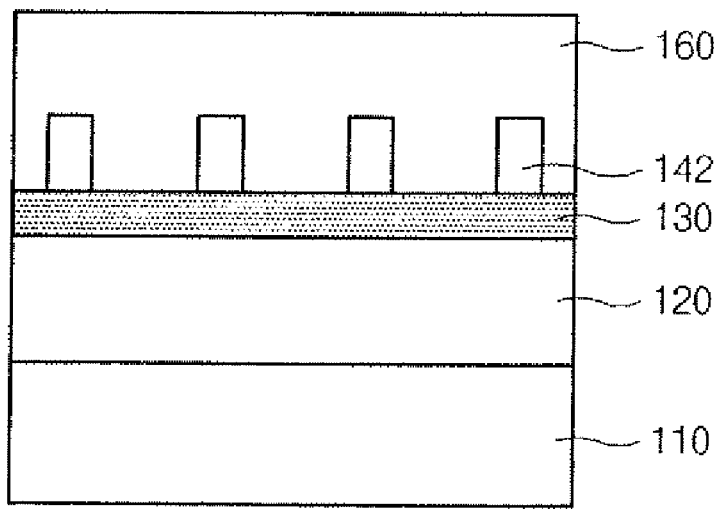
Figure 1E:
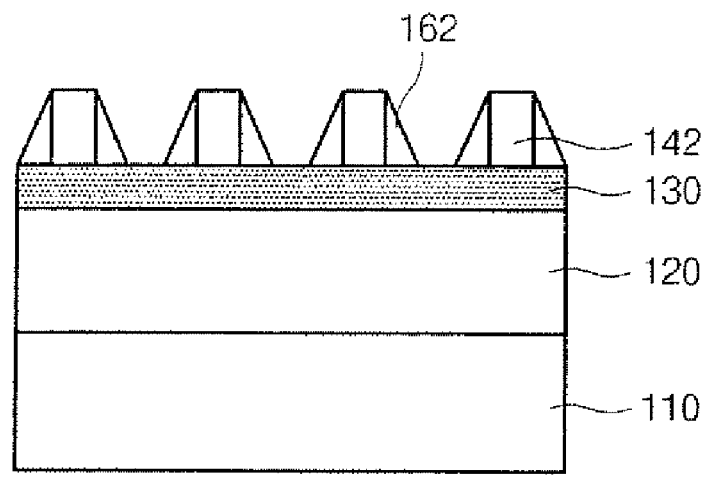
Figure 1F:
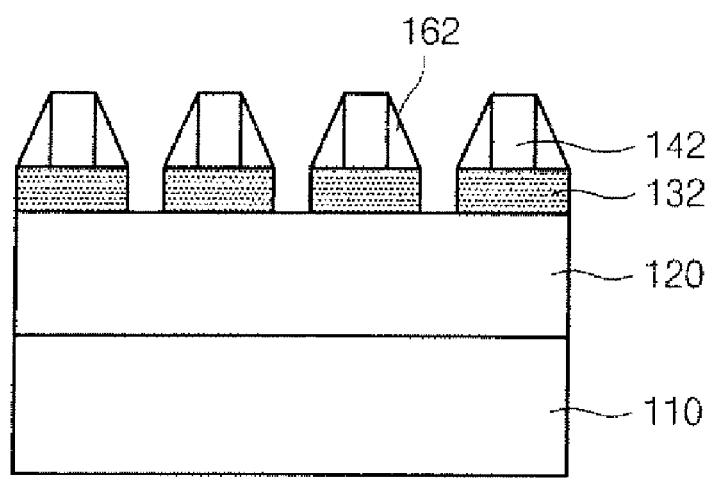

Referring to FIGS. 1d and 1f, the photoresist pattern 150 is removed. A first insulating film 160 is formed over the semiconductor substrate 110 to fill the third hard mask layer pattern 142. The first insulating film 160 is etched via an etchback method to form a spacer 162 on a sidewall of the third hard mask layer pattern 142. The second hard mask layer 130 is selectively etched using the spacer 162 and the third hard mask layer pattern 142 as an etching mask to form a second hard mask layer pattern 132.

According to another embodiment of the invention, the first insulating film 160 is preferably formed of a silicon nitride ($Si_3N_4$) film. In addition, the thickness of the first insulating film is preferably adjusted so that the latitudinal line width of the spacer 162 is substantially equal to the width of the third hard mask layer pattern 142. In another embodiment of the invention, the selective etching process for the second hard mask layer 130 is preferably performed by an anisotropic dry etching method. In addition, a ratio of the line width of the second hard mask layer pattern 132 to the width of the space defined between the neighboring third hard mask layer patterns 132 is preferably substantially about 3:1.

Figure 1G:
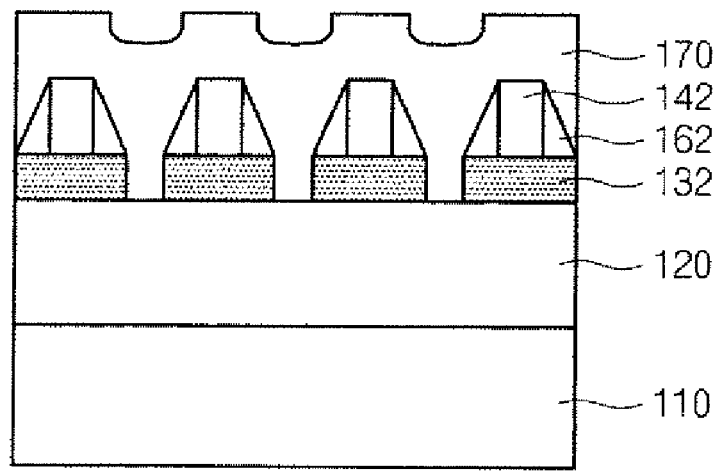
Figure 1H:
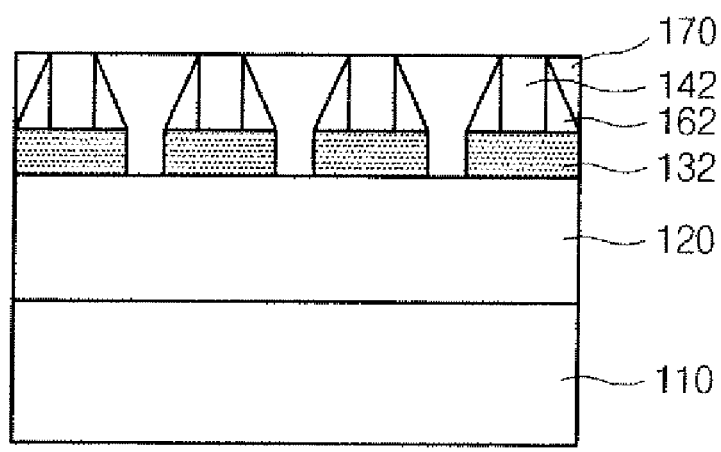
Figure 1I:
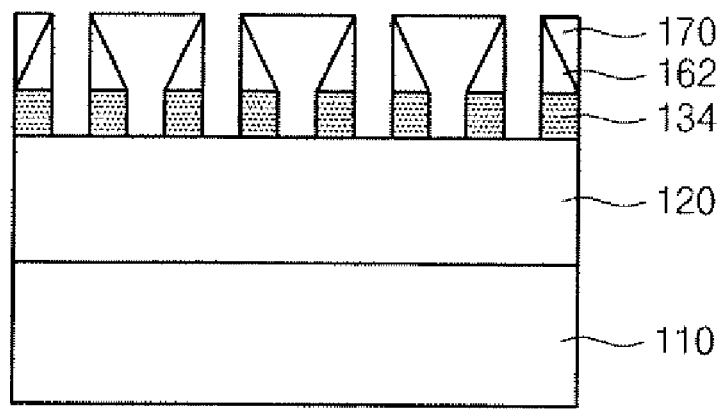

Referring to FIGS. 1g to 1i, a second insulating film 170 is formed over the semiconductor substrate 110 to fill the third hard mask layer pattern 142 and the second hard mask layer pattern 132. The second insulating film 170 is polished until the top surface of the third hard mask layer pattern 142 is exposed. The third hard mask layer pattern 142 and its underlying second hard mask layer pattern 132 are selectively etched using the second insulating film 170 as an etching mask to form a fifth hard mask layer pattern 134 exposing the first hard mask layer 120.

According to one embodiment of the invention, the second insulating film 170 is preferably formed of a silicon nitride ($Si_3N_4$) film. In addition, the polishing process for the second insulating film 170 is preferably performed by a chemical mechanical polishing ("CMP") method. In another embodiment of the invention, the selective etching process for the third hard mask layer pattern. 142 and its underlying second hard mask layer pattern 132 is preferably performed by an anisotropic dry etching method.

Figure 1J:
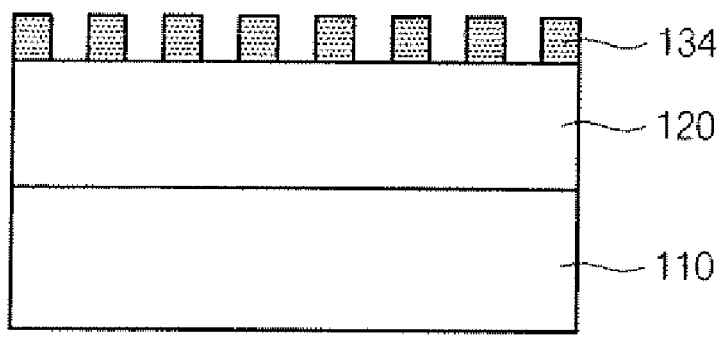
Figure 1K:
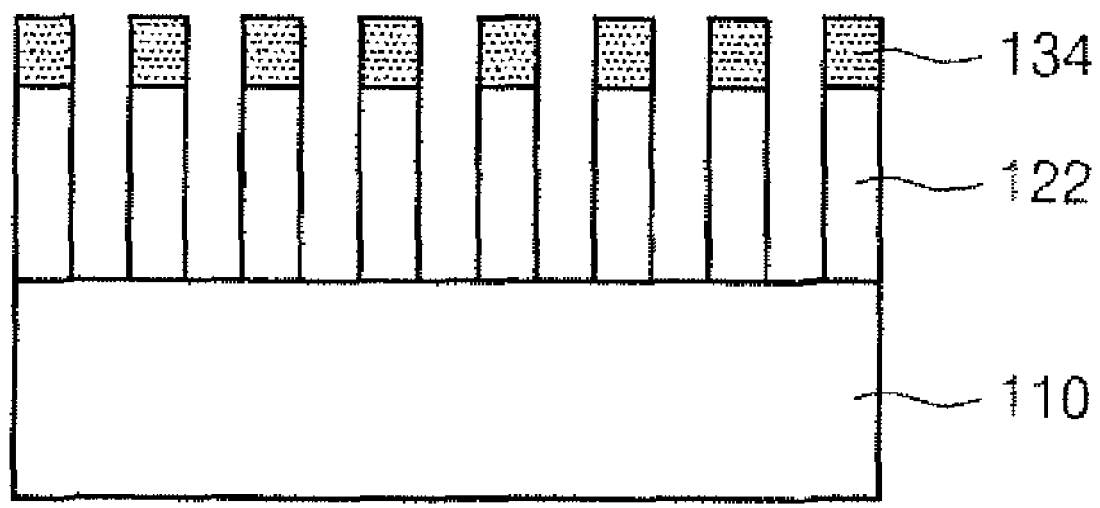

Referring to FIGS. 1j to 1k, the second insulating film 170 and the spacer 162 are removed. The first hard mask layer 120 is selectively etched using the fifth hard mask layer pattern 134 as an etching mask to form a first hard mask layer pattern 122. The etch-target layer is etched using the first hard mask layer pattern 122 as an etching mask to form a fine pattern, According to one embodiment of the invention, the removing process for the second insulating film 170 and the spacer 162 is preferably performed by a wet etching method including $H_3PO_4$. In addition, a ratio of the line width of the first hard mask layer pattern 122 to the width of the space defined between the neighboring first hard mask layer patterns 122 is preferably substantially about 1:1. Accordingly, a fine pattern can be formed in the semiconductor device based on the self aligned double exposure technology having one mask process.

As described above, according to the semiconductor device and the pattern formation method for the same, it becomes possible to form a fine pattern having uniform critical dimension (CD), irrespective of the overlay accuracy of exposure equipment. Accordingly, the integration and yield of semiconductor devices are improved. Moreover, since the double exposure technique uses one exposure mask, the overall fine pattern formation process is simplified to reduce processing costs.

The foregoing embodiments of the invention are illustrative and not limiting. Various alternatives and equivalents are possible. The invention is not limited by the lithography steps described herein, nor is the invention limited to any specific type of semiconductor device. For example, the invention may be implemented in a dynamic random access memory (DRAM) device or non volatile memory device. Other additions, subtractions, or modifications are obvious in view of the disclosure and are intended to fall within the scope of the appended claims.

What is claimed is:

1. A method for forming a pattern in a semiconductor device, the method comprising the steps of:
   forming a first hard mask layer over a semiconductor substrate;
   forming a second hard mask layer pattern over the first hard mask layer;
   forming a spacer on a sidewall of the second hard mask layer pattern;
   selectively etching the first hard mask layer by using the spacer and the second hard mask layer pattern as an etching mask to form a first hard mask layer pattern underlying the second hard mask layer pattern;
   forming a first insulating film filling the second hard mask layer pattern and the first hard mask layer pattern;
   selectively etching the second hard mask layer pattern and the underlying first hard mask layer pattern to form a third hard mask layer pattern;
   removing the first insulating film and the spacer; and
   patterning the semiconductor substrate by using the third hard mask layer pattern as an etching mask to form a fine pattern.

2. The method of claim 1, wherein the step of forming the second hard mask layer pattern comprises the steps of:
   forming a second hard mask layer over the first hard mask layer;
   forming a photoresist film over the second hard mask layer;
   exposing and developing the photoresist film by using a line/space mask to form a photoresist pattern; and
   selectively etching the second hard mask layer by using the photoresist pattern as an etching mask to form the second hard mask layer pattern.

3. The method of claim 2, wherein a ratio of a line width of the photoresist pattern to a width of the space defined between the neighboring photoresist patterns is in a range of about 1.5:2.5~0.5:3.5.

4. The method of claim 2, wherein a ratio of a line width of the photoresist pattern to a width of the space defined between the neighboring photoresist patterns is substantially about 1:3.

5. The method of claim 2, comprising etching the second hard mask layer by an anisotropic dry etching method.

6. The method of claim 1, wherein the step of forming the spacer comprises:
   forming a second insulating film filling the second hard mask layer pattern over the semiconductor substrate; and
   etching the second insulating film by using an etch-back method to form the spacer on a sidewall of the second hard mask layer pattern.

7. The method of claim 6, wherein the second insulating film comprises a silicon nitride (Si3N4) film.

8. The method of claim 6, wherein a ratio of latitudinal line width of the spacer to a width of the second hard mask layer pattern is substantially about 1:1.

9. The method of claim 1, comprising etching the first hard mask layer by an anisotropic dry etching method.

10. The method of claim 1, wherein the step of forming the first insulating film comprises the steps of:
    forming the first insulating film over the semiconductor substrate to fill the second hard mask layer pattern and the first hard layer pattern; and
    polishing the first insulating film until the second hard mask layer pattern is exposed.

11. The method of claim 10, comprising polishing the first insulating film by a chemical mechanical polishing ("CMP") method.

12. The method of claim 1, wherein the first insulating film comprising a silicon nitride (Si3N4) film.

13. The method of claim 1, comprising etching the second hard mask layer pattern and the underlying first hard mask layer pattern by an anisotropic dry etching method.

14. The method of claim 1, comprising removing the first insulating film and the spacer by a wet etching method using H3PO4.

15. The method of claim 1, wherein a ratio of a line width of the fine pattern to the width of a space between the neighboring fine patterns is substantially about 1:1.

16. The method of claim 1, further comprising forming a buffer layer in an interface defined between the first hard mask layer and the semiconductor substrate.

17. The method of claim 16, comprising having the buffer layer of a silicon oxynitride (SiON) film to serve as an etch stop layer in the wet etching process including H3PO4.

* * * * *